(12) United States Patent
Edelstein et al.

(10) Patent No.: US 7,993,817 B2
(45) Date of Patent: Aug. 9, 2011

(54) STRUCTURE WITH SELF ALIGNED RESIST LAYER ON AN INSULATING SURFACE AND METHOD OF MAKING SAME

(75) Inventors: Daniel C. Edelstein, White Plains, NY (US); Elbert E. Huang, Carmel, NY (US); Robert D. Miller, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 178 days.

(21) Appl. No.: 12/356,100

(22) Filed: Jan. 20, 2009

(65) Prior Publication Data

US 2010/0181677 A1   Jul. 22, 2010

(51) Int. Cl.
G03F 7/26 (2006.01)
(52) U.S. Cl. ...................................................... 430/315
(58) Field of Classification Search .................. 430/313, 430/311, 315
See application file for complete search history.

(56) References Cited

U.S. PATENT DOCUMENTS

| | | | | |
|---|---|---|---|---|
| 5,945,250 A | * | 8/1999 | Aoai et al. | 430/270.1 |
| 6,642,147 B2 | * | 11/2003 | Dokumaci et al. | 438/691 |
| 2004/0150096 A1 | | 8/2004 | Purushothaman et al. | |
| 2005/0208430 A1 | | 9/2005 | Colburn et al. | |
| 2008/0220615 A1 | * | 9/2008 | Brunner et al. | 438/735 |

FOREIGN PATENT DOCUMENTS

JP          02-264259       * 10/1990
* cited by examiner

*Primary Examiner* — Kathleen Duda
*Assistant Examiner* — Caleen O Sullivan
(74) *Attorney, Agent, or Firm* — Katherine S. Brown; Roberts Mlotkowski Safran & Cole, P.C.

(57) ABSTRACT

A structure is provided with a self-aligned resist layer on an insulator surface and non-lithographic method of fabricating the same. The non-lithographic method includes applying a resist on a structure comprising at least one of interconnects formed in an insulator material. The method further comprises exposing the resist to energy and developing the resist to expose surfaces of the interconnects. The method further comprises depositing metal cap material on the exposed surfaces of the interconnects.

24 Claims, 7 Drawing Sheets

US 7,993,817 B2

STRUCTURE WITH SELF ALIGNED RESIST LAYER ON AN INSULATING SURFACE AND METHOD OF MAKING SAME

FIELD OF THE INVENTION

The present invention relates generally to an interconnect structure and method of fabricating the same and, more particularly, to a structure with a self-aligned resist layer on an insulator surface and method of fabricating the same.

BACKGROUND

Electromigration is the transport of material caused by the gradual movement of ions in a conductor due to the momentum transfer between conducting electrons and diffusing metal atoms. The effect of electromigration is an important consideration to take into account in applications where high direct current densities are used, such as in microelectronics and related structures. In fact, electromigration is known to decrease the reliability of integrated circuits (ICs) and hence lead to a malfunction of the circuit. In the worst case, for example, electromigration leads to the eventual loss of one or more connections and intermittent failure of the entire circuit.

The effect of electromigration becomes an increasing concern as the size of the IC decreases. That is, as the structure size in ICs decreases, the practical significance of this effect increases. Thus, with increasing miniaturization the probability of failure due to electromigration increases in VLSI and ULSI circuits because both the power density and the current density increase.

In advanced semiconductor manufacturing processes, copper is used as the interconnect material. Basically, copper is preferred for its superior conductivity and electromigration resistance, for example, as compared to the prior Al(Cu) alloy interconnects. However, even copper interconnects have been facing the limitation of the electromigration lifetime or the upper limitation of the current density because of electromigration failure. To solve this problem, though, capping copper interconnects with CoWP or CoWB has been widely investigated. It has been found that the copper interconnects can have higher electromigration resistance when capped with CoWP or CoWB. This is because the top surface of the copper interconnects, which heretofore was capped with a dielectric barrier such as SiN or SiCN, and which resulted in this top surface being the fast diffusion path for copper electromigration, is effectively shut down for fast copper diffusivity and electromigration by a metal cap.

However, the CoWP or CoWB and even other metal capping materials can pose issues to the IC. For example, during the deposition of the CoWP or CoWB or other metal capping materials, residual metal can be deposited on the surface of the dielectric insulator material between the copper interconnects. Since the distance between the neighboring copper lines is becoming smaller as the device shrinks, the potential for shorting between the interconnects is becoming even more serious, especially if residual metal remains on the dielectric insulator material between the interconnects.

Accordingly, there exists a need in the art to overcome the deficiencies and limitations described hereinabove.

SUMMARY

In a first aspect of the invention, a method comprises applying a resist on a structure comprising interconnects formed in an insulator material. The method further comprises exposing the resist to energy and developing the resist to expose surfaces of the interconnects.

In another aspect of the invention, a method comprises: forming interconnect structures in a dielectric layer; forming a layer of positive tone resist on exposed surfaces of the interconnect structures and the dielectric layer; exposing the positive tone resist to non-lithographically patterned energy; developing the positive tone resist to expose the surfaces of the interconnects while maintaining a protective layer on the surface of the dielectric material between the interconnects; depositing metal cap material on the exposed surfaces of the interconnects; and removing the positive tone resist from the dielectric material between the interconnects, which includes residual metal cap material deposited during the metal cap film deposition.

In another aspect of the invention, an intermediate structure comprises interconnect structures in a dielectric layer and a layer of positive tone spin-on organic polymer having a photoacid generator on exposed surfaces of the dielectric layer. The photoacid generator leads to the positive tone spin-on organic polymer being selectively removed over the interconnect structures after exposure to energy. A metal cap material of a copper based material is provided on exposed surfaces of the interconnects and residual metal cap material on the layer of non-lithographic positive tone resist.

In yet another aspect of the invention, a structure comprises interconnect structures in a dielectric layer; a layer of polymer having a photoacid generator on exposed surfaces of the dielectric layer; and metal cap material on exposed surfaces of the interconnects and residual metal cap material on the layer of polymer.

BRIEF DESCRIPTION OF SEVERAL VIEWS OF THE DRAWINGS

The present invention is described in the detailed description which follows, in reference to the noted plurality of drawings by way of non-limiting examples of exemplary embodiments of the present invention, in which.

DETAILED DESCRIPTION

The present invention relates generally to an interconnect structure and method of fabricating the same and, more particularly, to an interconnect structure with a self-aligned capping resist layer on an insulator surface which prevents residual capping metal from, amongst other things, shorting the device. In implementing the fabrication processes and structures in accordance with the invention, a self-aligned resist material is deposited on an insulator material between interconnects within the structure. During metal capping of the interconnects and/or other wires, residual metal will be deposited on the self-aligned resist material. The metal capping layer can be CoWP or CoWB, for example. In subsequent processes, the self-aligned resist material with the residual metal capping material can be stripped from the structure thereby preventing the metal capping material from shorting the device, amongst other issues.

FIRST ASPECT OF THE INVENTION

Figure 1:
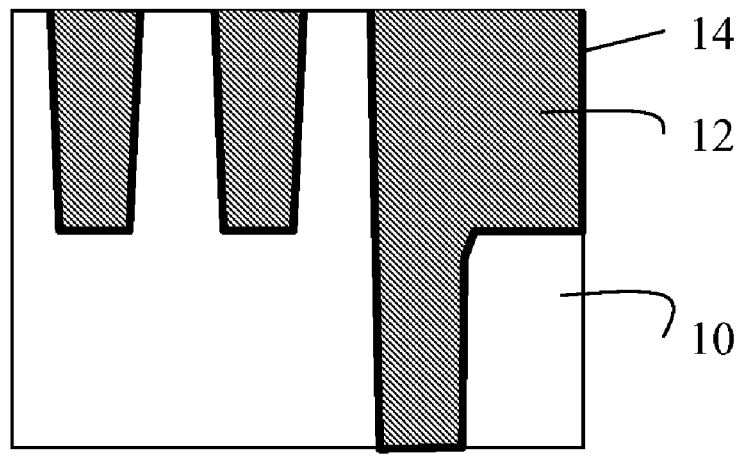
FIGS. 1-5 show intermediate structures and respective fabrication processes in accordance with a first aspect of the invention.

FIGS. 1-5 show intermediate structures and respective fabrication processes in accordance with a first aspect of the invention. In particular, FIG. 1 shows a structure comprising interconnects (generally depicted as reference numeral 12) embedded within a dielectric (insulator) layer 10. In embodiments, the dielectric material 10 is $SiO_2$, low-k SiCOH, ultralow-k porous SiCOH, or other dielectric material.

In embodiments, the interconnects 12 may be copper, lined with another metal 14 such as, for example, TaN or Ta. The interconnects 12 may be formed using conventional dual damascene fabrication processes such that further explanation is not required herein for an understanding of the invention.

Figure 2:
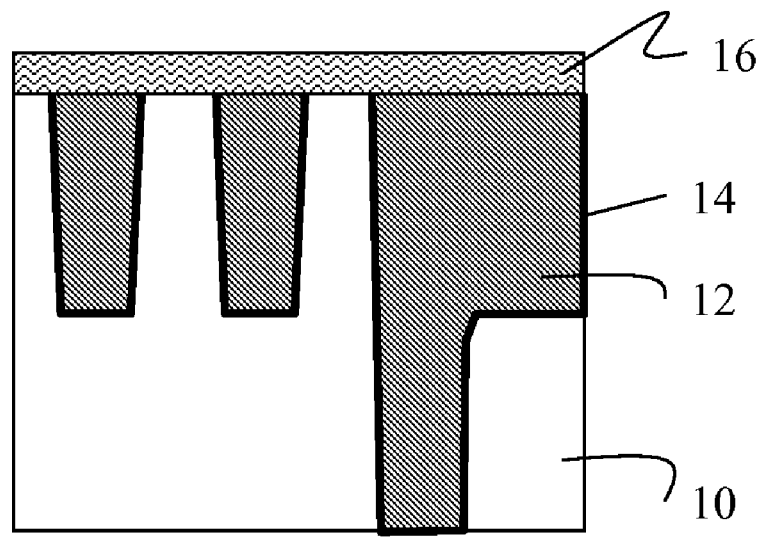

In FIG. 2, a capping resist layer 16 is applied to the structure of FIG. 1. In particular, the capping resist layer 16 may be a spin-on self-aligning resist layer such as, for example, an organic polymer. In embodiments, the capping resist layer 16 is a class of organic photoresist materials containing iodonium salts, which possesses a Cu-catalyzed decomposition property.

In more particular embodiments, the capping resist layer 16 is a positive tone non-lithographic selective cap. Non-lithographic is required for absolute alignment, in the presence of overlay and dimensional control variations, such that the insulator layer 10 remains capped and the surfaces of the interconnects 12 are exposed in subsequent processes. In embodiments, the entire surface of all the interconnects 12 is exposed; whereas, the entire surface of the insulator layer 10 remains capped to thereby protect the insulator layer 10 during subsequent metal capping processes. The capping resist layer 16 may range in thickness from about 20 nm to 500 nm.

In more particular embodiments, the organic photoresist materials can include a photoacid generator (PAG) which can turn a material into either a negative or positive variety. In the embodiment described herein, the PAG leads to the capping resist layer 16 being selectively removed over the interconnect 12, after exposure to energy. For such resist systems, the copper catalyzes the decomposition of the iodonium sensitizer to produce acid. This acid is used to activate the resist upon thermal heating which, in turn, prevents development of the resist. The most common reaction would be cleavage of a t-butyl ester to produce a carboxylic acid, which would be soluble in base. Alternatively a material like S-cap would liberate the free phenolic group, also soluble in base. In either case, irradiation should not be necessary since the copper is catalyzing the production of acid, which is de-protecting the resist.

Figure 3:
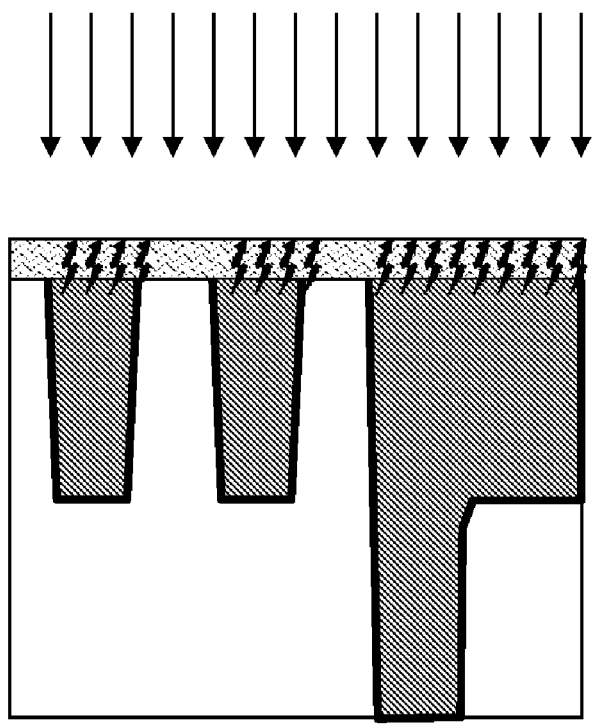

As shown in FIG. 3, the capping resist layer 16 is exposed to energy (e.g., thermal, optical, e-beam) to induce a self-aligned Cu-catalyzed activation of the capping resist layer 16 by acid generation, ring-breaking, or other mechanism. For example, the capping resist layer 16 can be flood-exposed to UV or DUV optical radiation. This will polymerize the capping resist layer 16 over the non-Cu regions so that it can be developed off of the Cu regions, e.g., interconnects 12. In the case of PAG, mild heating will induce the self-aligned Cu-catalyzed activation. The amount of heat needed depends on the protecting group, as should be understood by those of skill in the art.

Figure 4:
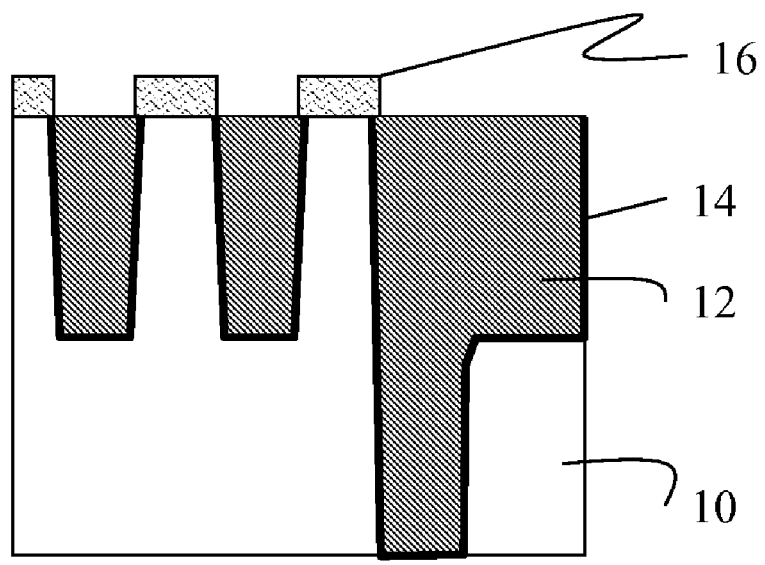

In FIG. 4, the capping resist layer 16 is developed and, if necessary, baked, using conventional processes. This results in the capping resist layer 16 selectively being removed from the metal surfaces of the interconnects 12 and remaining on the exposed surface of the insulator layer 10.

Figure 5:
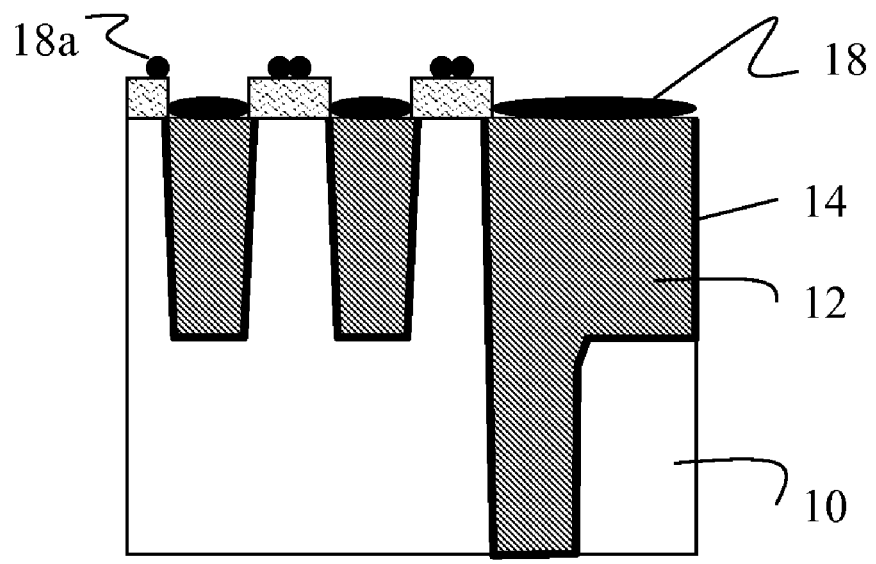

In FIG. 5, a metal layer 18 such as, for example, CoWP, CoWB, CVD-Ru, CVD-W, etc. is deposited over the structure of FIG. 4. More specifically, using an electroless process, a selective cap 18 of CoWP or CoWB can be formed on the surfaces of the interconnects 12. During this process, sporadic metal residue 18a is formed on the capping resist layer 16, which protects the surface of the insulator layer 10.

Figure 6:
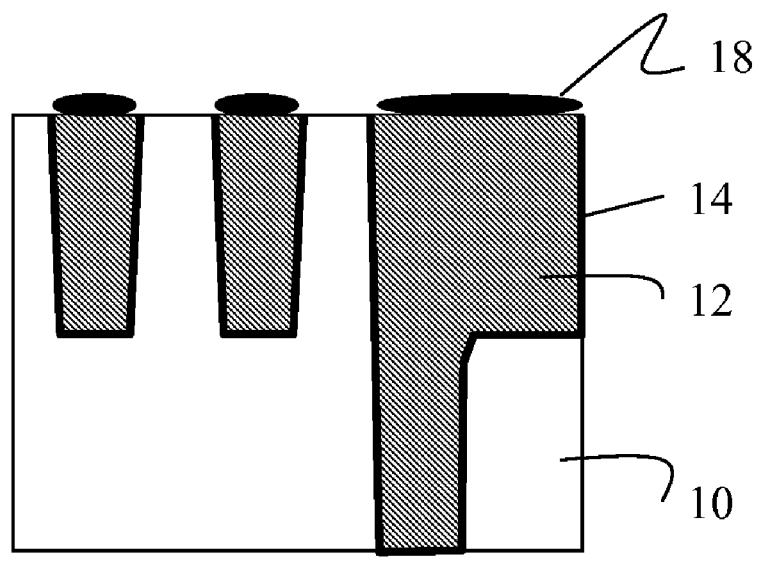
FIG. 6 shows a final structure and accompanying fabrication processes in accordance with the first aspect of the invention.

FIG. 6 shows a final structure and respective fabrication processes in accordance with the invention. As shown in FIG. 6, the capping resist layer 16 and any sporadic metal residue 18a is removed by a solvent or ashing process, e.g., stripping or lifting off the capping resist layer 16. This lifts off any spontaneous metal residues from between the interconnects 12, eliminating a source of shorts yield loss, time-dependent dielectric breakdown (TDDB) failures, and I-V leakages.

SECOND ASPECT OF THE INVENTION

Figure 7:
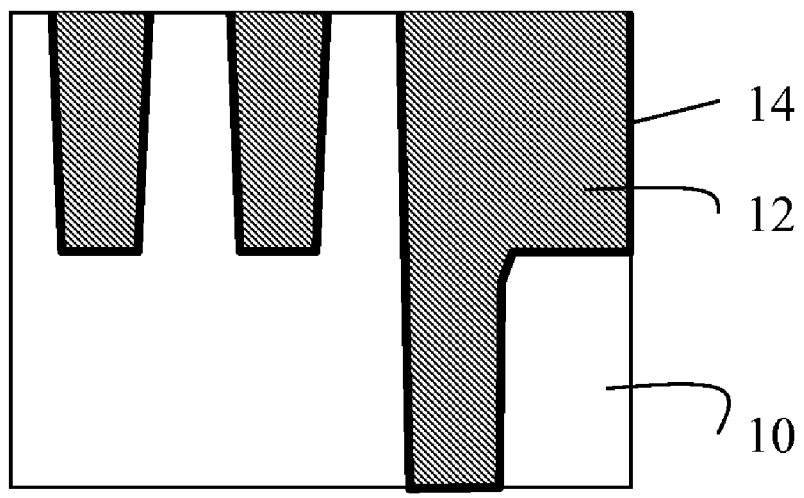
FIGS. 7-12 show intermediate structures and respective fabrication processes in accordance with a second aspect of the invention.

FIGS. 7-12 show intermediate structures and respective fabrication processes in accordance with a second aspect of the invention. In particular, FIG. 7 shows a structure comprising interconnects 12 embedded within a dielectric (insulator) layer 10. In embodiments, the dielectric material 10 is $SiO_2$, low-k SiCOH, ultralow-k porous SiCOH, or other dielectric material. In embodiments, the interconnects 12 may be copper, lined with another metal 14 such as, for example, TaN or Ta. The interconnects 12 may be formed using conventional dual damascene fabrication processes.

Figure 8:
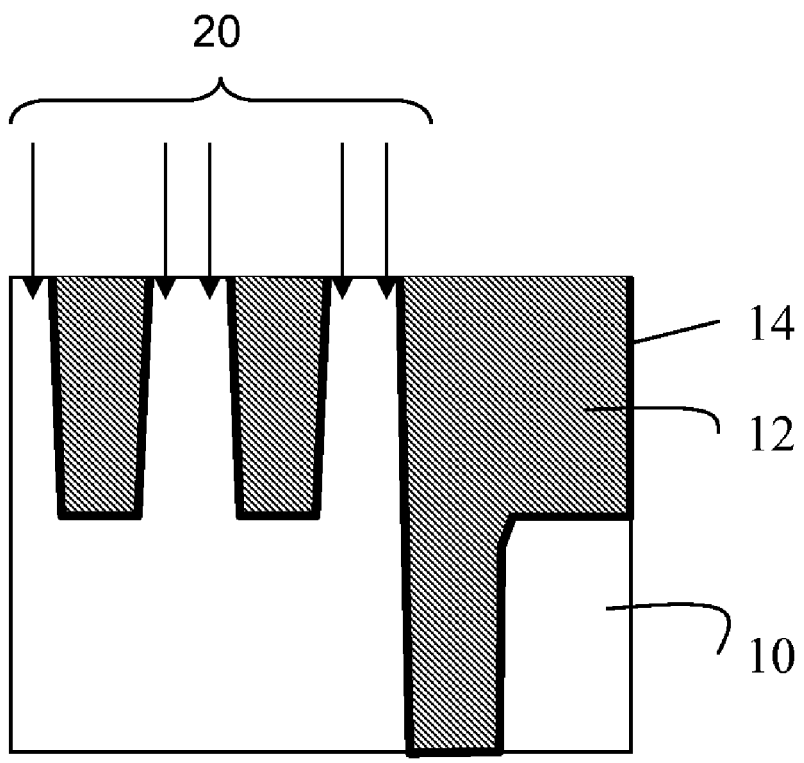

In FIG. 8, a diffuse poisoning agent 20 is applied to the structure of FIG. 7. In embodiments, the poisoning agent may be, for example, $NH_3$ or an amine gas. In embodiments, the poisoning agent 20 is applied to the insulator layer 10 and is designed to out-diffuse from the insulator layer 10 to ensure that a subsequently applied resist layer remains on the surface of the insulator layer 10 when exposed to, for example, UV. In embodiments, the poisoning agent 20 is applied by exposure of the wafer at room temperature or elevated temperature, such as approximately 100° C. to 400° C., for times ranging from approximately 15 seconds to several minutes or more, to a gas or plasma containing $NH_3$, forming gas ($N_2+H_2$), $N_2$ alone, or other amine, and then possibly post-baking at modest temperature and time (e.g., 100° C. for several minutes) to react residual $N_2$ with residual $H_2$ within the insulator to form amine compounds. In the case of plasma exposure, a typical PECVD reactor or other vacuum plasma preclean chamber may be used, and the wafer may be exposed at room temperature or elevated temperature such as approximately 100° C. to approximately 400° C. for approximately 15 seconds to as much as several minutes.

Figure 9:
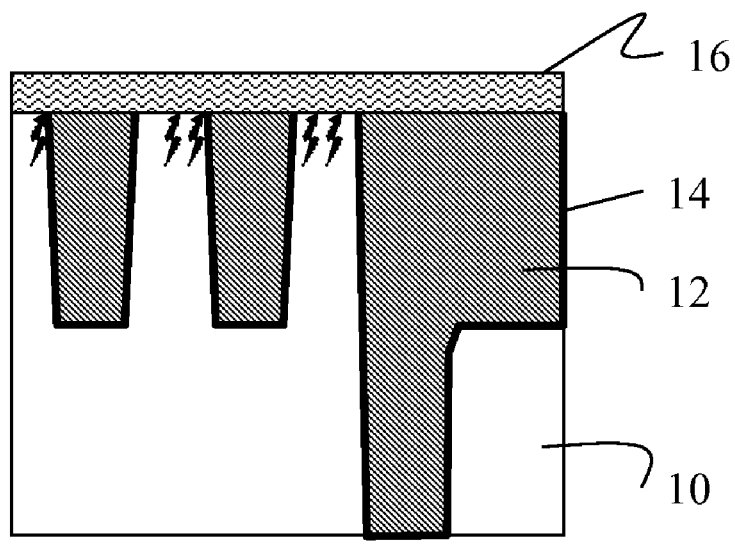

In FIG. 9, the capping resist layer 16 is applied to the structure of FIG. 8. In particular, the capping resist layer 16 may be a spin-on self-aligning resist layer such as, for example, an organic polymer. In embodiments, the capping resist layer 16 is a class of organic chemically-amplified photoresist materials containing iodonium salts. In embodiments, the capping resist layer 16 possesses a Cu-catalyzed decomposition property. In more particular embodiments, the capping resist layer 16 functions as a positive tone poison non-lithographic selective cap. The capping resist layer 16 may range in thickness from about 20 nm to 500 nm.

Figure 10:
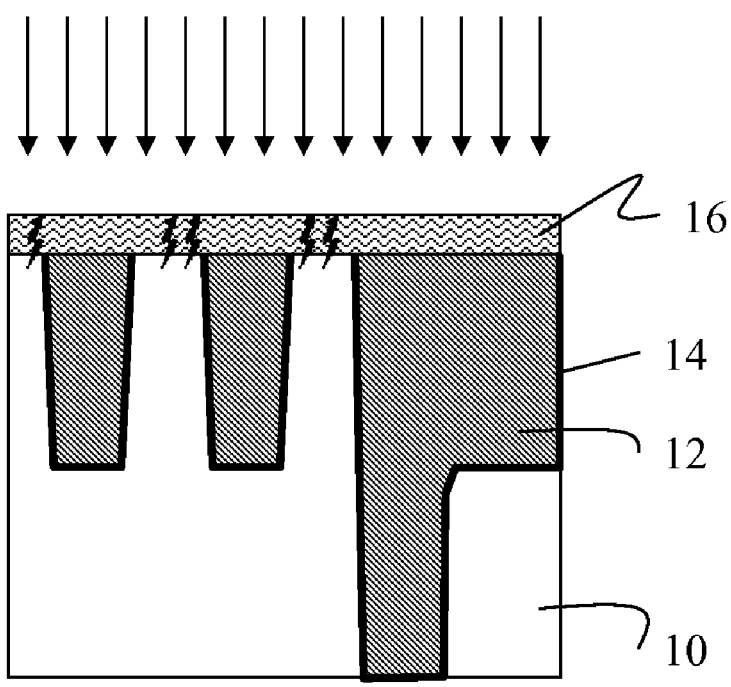

As shown in FIG. 10, the capping resist layer 16 is exposed to energy (e.g., thermal, optical, e-beam) to induce a self-aligned Cu-catalyzed activation of the capping resist layer 16 by out-diffusion of amine poison from the insulator film and subsequent poisoning of the resist layer by acid neutralization, ring-breaking, or other mechanism. For example, the capping resist layer 16 can be flood-exposed to UV or DUV optical radiation. This will induce self-aligned poisoning of the capping resist layer 16, e.g., cause out diffusion of the poisoning over the insulator layer 10.

Typical exposures could be 100° C. thermal bake for several minutes, or blanket DUV flood exposure at 193 nm wavelength at a dose of approximately 20 to approximately 100 mJ/cm$^2$ (I need to check these numbers). In embodiments, in this process, the entire surface of all of the interconnects 12 will be exposed; whereas, the entire surface of the insulator layer 10 remains capped to thereby protect the insulator layer 10 during subsequent capping processes.

Figure 11:
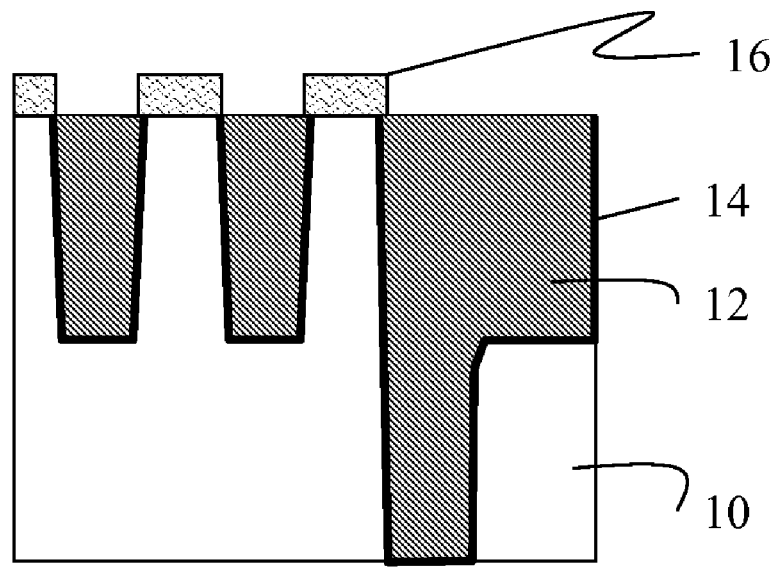

In FIG. 11, the capping resist layer 16 is developed and, if necessary, baked, using conventional processes. This results in the capping resist layer 16 selectively being removed from the metal surfaces of the interconnects 12 and remaining on the exposed surface of the insulator layer 10.

Figure 12:
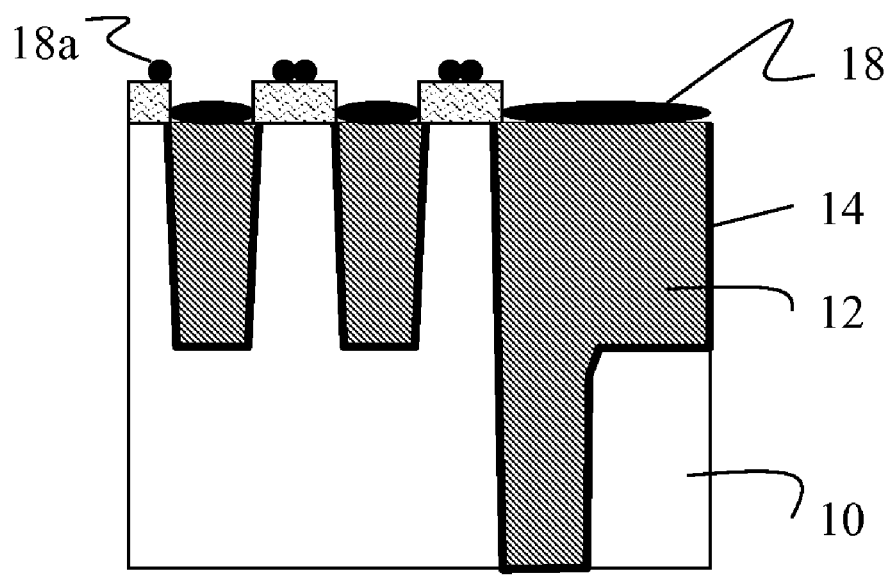

In FIG. 12, a metal layer 18 such as, for example, CoWP, CoWB, CVD-Ru, CVD-W, etc. is deposited over the structure of FIG. 11. More specifically, using an electroless process, a selective cap 18 of CoWP or CoWB can be formed on the surfaces of the interconnects 12. During this process, sporadic metal residue 18a is formed on the capping resist layer 16, which is protecting the surface of the insulator layer 10.

Figure 13:
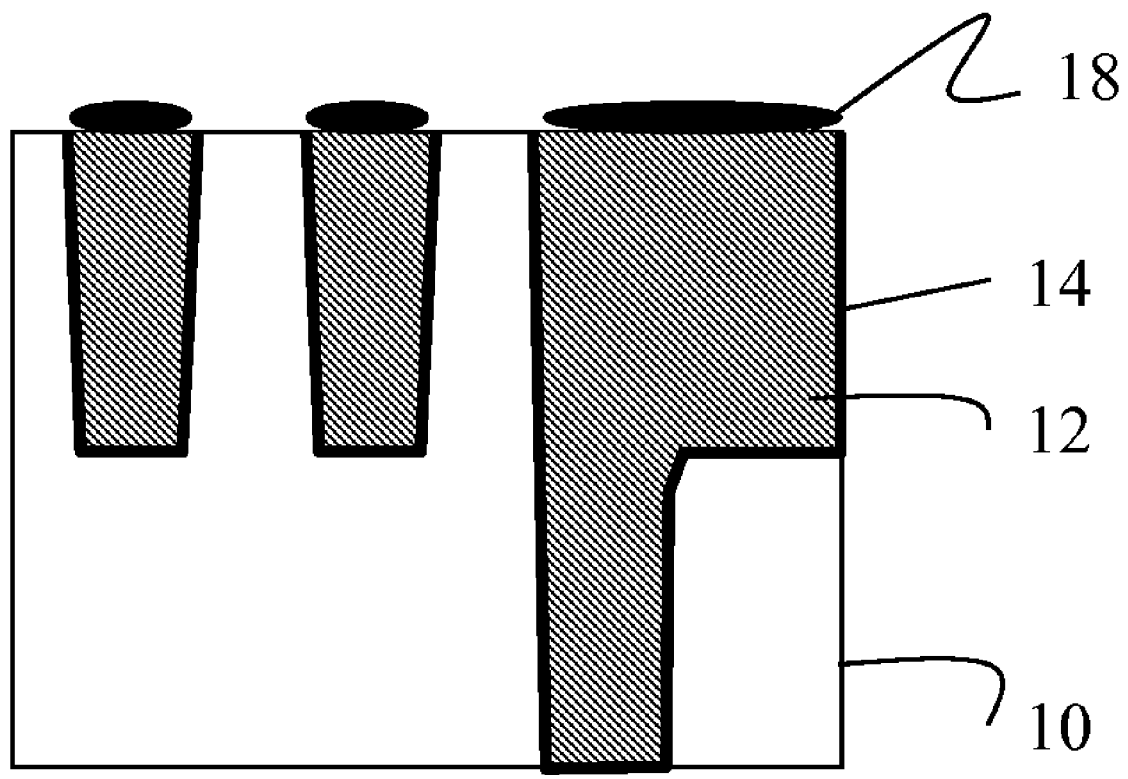
FIG. 13 shows a final structure and accompanying fabrication processes in accordance with the second aspect of the invention.

FIG. 13 shows a final structure and respective fabrication processes in accordance with the invention. As shown in FIG. 13, the capping resist layer 16 and any sporadic metal residue 18a can be removed by a solvent or ashing process, e.g., stripping or lifting off the capping resist layer 16. This lifts off any spontaneous metal residues from between the interconnects 12, eliminating a source of shorts yield loss, Time-dependent Dielectric Breakdown (TDDB) failures, and I-V leakages.

The methods and structures as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with the structures of the invention) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed is:

1. A method comprising:
    applying a resist on exposed surfaces of a structure comprising at least one metal interconnect formed in an insulator material;
    exposing the resist to non-lithographically patterned energy to induce a catalyzed activation of the resist, wherein material of the at least one metal interconnect induces the catalyzed activation; and
    developing the resist to expose surfaces of the at least one metal interconnect and not expose surfaces of the insulator material.

2. The method of claim 1, further comprising depositing metal cap material on the exposed surfaces of the at least one metal interconnect.

3. The method of claim 1, wherein the depositing includes depositing residual metal cap material on the resist.

4. The method of claim 3, further comprising removing the residual metal cap material and the resist from the insulator material.

5. The method of claim 4, wherein the removing is performed by a solvent or ashing process.

6. The method of claim 1, wherein the metal cap material is one of CoWP and CoWB.

7. The method of claim 1, wherein the developing results in the resist remaining on the surfaces of the insulator material and not on the surfaces of the at least one metal interconnect, thereby protecting the insulator material surfaces from deposition of residual metal cap material.

8. The method of claim 1, wherein the resist is a spin-on organic polymer.

9. The method of claim 8, wherein the resist comprises iodonium salt and a photoacid generator (PAG).

10. The method of claim 9, wherein:
    the material of the at least one metal interconnect comprises copper (Cu);
    the catalyzed activation is a Cu-catalyzed activation such that the copper of the at least one metal interconnect catalyzes decomposition of the iodonium salt in the resist to produce an acid, which acts to de-protect the resist; and
    the acid activates the resist and prevents the development of the resist on the exposed surfaces of the at least one metal interconnect.

11. The method of claim 10, wherein the exposing the resist causes polymerization of the resist over the insulator material such that the resist can be developed off the exposed surfaces of the at least one metal interconnect.

12. The method of claim 11, wherein the Cu-catalyzed activation is a reaction that induces production of the acid by cleavage of a t-butyl ester to produce a carboxylic acid.

13. The method of claim 1, wherein the resist is a positive tone copper catalyzed self-capping layer.

14. The method of claim 1, wherein the resist is self-aligning to the insulator material.

15. The method of claim 1, wherein the exposing the resist to the non-lithographically patterned energy induces the catalyzed activation of the resist by acid generation, ring-breaking down, or other mechanism.

16. A method comprising:
    forming interconnect structures in a dielectric layer;
    forming a layer of positive tone resist on exposed surfaces of the interconnect structures and the dielectric layer;
    exposing the positive tone resist to non-lithographically patterned energy to induce a catalyzed activation of the positive tone resist, wherein material of the interconnect structures induces the catalyzed activation;
    developing the positive tone resist to expose the surfaces of the interconnect structures while maintaining a protective layer on the surfaces of the dielectric layer between the interconnect structures;
    depositing metal cap material on the exposed surfaces of the interconnect structures; and
    removing the positive tone resist from the dielectric layer between the interconnect structures, which includes residual metal cap material deposited during the depositing.

17. The method of claim 16, wherein the positive tone resist is a spin-on organic polymer.

18. The method of claim 16, wherein the removing is performed by a solvent or ashing process.

19. The method of claim 16, wherein the resist is self-aligning to the dielectric layer.

20. A method comprising:
    applying a poison to a structure comprising at least one metal interconnect formed in an insulator material such that the insulator material comprises the poison;
    depositing a resist on the structure;
    exposing the resist to non-lithographically patterned energy to induce a self-aligned catalyzed activation of the resist by poison out-diffusion; and
    developing the resist to expose surfaces of the at least one metal interconnect and not expose surfaces of the insulator material.

21. The method of claim 20, wherein the resist is a positive tone poison non-lithographic selective cap.

22. The method of claim 21, wherein the poison added is $NH_3$ or amine gas that out-diffuses from the insulator material.

23. The method of claim 22, wherein the poison is applied prior to depositing the resist.

24. The method of claim 23, wherein the applying the poison comprises exposing the structure at room temperature or elevated temperature to a gas or plasma containing the $NH_3$ to form amine compounds within the insulator material.

* * * * *